US006197644B1

(12) United States Patent
Gardner et al.

(10) Patent No.: US 6,197,644 B1
(45) Date of Patent: Mar. 6, 2001

(54) HIGH DENSITY MOSFET FABRICATION METHOD WITH INTEGRATED DEVICE SCALING

(75) Inventors: Mark I. Gardner, Cedar Creek; Mark C. Gilmer, Austin, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/187,258

(22) Filed: Nov. 6, 1998

(51) Int. Cl.[7] .................................................. H01L 21/336
(52) U.S. Cl. ........................ 438/279; 438/179; 438/286
(58) Field of Search ............................. 438/279, 286, 438/179, 401, 400; 257/401

(56) References Cited

U.S. PATENT DOCUMENTS

| 4,785,337 | * | 11/1988 | Kenney ............................ 438/286 |
| 4,954,218 | * | 9/1990 | Okumura et al. .................. 438/279 |
| 5,286,664 | | 2/1994 | Horiuchi ........................... 437/44 |
| 5,541,436 | | 7/1996 | Kwong et al. ..................... 257/410 |
| 5,633,185 | * | 5/1997 | Yiu et al. ......................... 438/279 |
| 5,674,788 | | 10/1997 | Wristers et al. .................. 437/239 |
| 6,008,081 | * | 12/1999 | Wu .................................... 438/279 |

OTHER PUBLICATIONS

S. Kusunoki et al, "Hot–Carrier–Resistant Structure by Re–Oxidized Nitrided Oxide Sidewall for Highly Reliable and High Performance LDD MOSFETS,"LSI Laboratory, Mitsubishi Electric Corporation, Japan, International Electron Devices Meeting, Washington, DC, Dec. 8–11, 1991 (5 pages).

Stanley Wolf, "Silicon Processing for the VSLI Era, vol. 3: The Submicron MOSFET," Lattice Press, Sunset Beach, California, 1995 (26 pages).

Stanley Wolf, "Silicon Processing For The VSLI Era, vol. 2: Processing Integration," Lattice Press, California, 1990, pp. 348–360, 436–440.

\* cited by examiner

Primary Examiner—Olik Chaudhuri
Assistant Examiner—Nathan Ha
(74) Attorney, Agent, or Firm—Skjerven Morrill MacPherson, LLP; Emmanuel A. Rivera

(57) ABSTRACT

In an integrated circuit, a pair of IGFET devices can be formed with reduced dimensions without requiring the use of higher resolution optical masks. A gate electrode is formed with a layer of silicon nitride and a photoresist layer formed thereon. The dimensions of the photoresist layer are reduced by a trim etch and the dimension of the nitride layer reduced by a nitride etch. After removing the photoresist layer, a silicon oxide layer is grown over the exposed gate electrode and substrate. The nitride layer is removed leaving a pattern in the silicon oxide layer. An anisotropic etch guided by the pattern in the silicon oxide layer divides the gate electrode into two portions with an aperture therebetween. By proper doping, a IGFET structure can be formed that has two IGFET devices having a shared source/drain region and occupying the same area on the surface of the substrate as a single IGFET device previously occupied.

21 Claims, 4 Drawing Sheets

HIGH DENSITY MOSFET FABRICATION METHOD WITH INTEGRATED DEVICE SCALING

CROSS-REFERENCE TO RELATED APPLICATIONS

This application is related to copending, commonly assigned, concurrently filed U.S. patent application Ser. No. 09/188,085, which names Mark I. Gardner, Fredrick N. Hause, and Michael P. Duane as inventors and is entitled "Mask For Asymmetric Transistor Formation With Paired Transistors."

This application is related to copending, commonly assigned, concurrently filed U.S. patent application Ser. No. 09/187,894, which names Daniel Kadosh and Mark I. Gardner as inventors and is entitled "Asymmetric IGFET Devices With Spacers Formed By HDP Techniques."

BACKGROUND OF THE INVENTION

1. Field of the Invention

This invention relates generally to the fabrication of integrated circuits, and more particularly, to the fabrication of insulated gate, field effect transistor (IGFET) devices.

2. Description of the Related Art

An insulated-gate field effect transistor (IGFET) device 5, such as a metal-oxide semiconductor field-effect transistor (MOSFET) is shown in FIG. 1. A substrate 10 has a doped well region 12, a p-doped well region that will be used for purposes of illustration. The substrate 10 has a p-doped channel region 14 that provides a conducting path between the n-doped source/drain region 16A, 16B and the n-doped source/drain region 18A, 18B. In addition, an p-doped punch-through region 20 is provided below the channel region 14. Also formed in the substrate 10 are the isolation structures 22 and 24. The gate structure of the IGFET device 5 includes a gate dielectric 26, directly over the channel region 14, and a gate electrode 28 over the gate dielectric 26. The gate structure 26, 28 can include spacers 30, 32 formed against the walls of the gate structure 26, 28. An insulating layer 34 covers the substrate 10 and the gate structure 26, 28. The insulating layer 34 has vias formed therein, and the vias are filled with a conducting material. The conducting material provides conducting vias 36 to source/drain (electrode) regions 16A, 16B and 18A and 18B and to the gate electrode 28. An insulating layer 38, formed over insulating layer 34, is patterned and the portions of the insulating layer formed by patterning are filled with conducting material to provide conducting paths 40. The conducting paths 40 and the remaining insulating material 38 are referred to as the interconnect layer 38, 40, the interconnect layer providing the electrical coupling between the IGFET device 5 and the remainder of the integrated circuit.

The operation of the IGFET device 5 can be understood as follows. A voltage applied to the gate electrode 28 causes a transverse field in the channel region 14. The transverse field controls (e.g., modulates) the current flow between source/drain region 16A, 16B and source/drain region 18A, 18B. The punch-through region 20 is formed to prevent parasitic effects that can occur when this region is not formed in the device 5. The spacers 30, 32 and the dual-structured, doped source/drain regions 16A, 16B and 18A, 18B address a problem generally referred to as the "hot-carrier" effect. When only one source/drain region 16A and 18A is present and is formed by a ion implantation aligned with the electrode structure 26, 28, charge carriers from these regions can migrate into the channel region 14 and be trapped by the gate dielectric 26. These trapped charge carriers adversely effect the transverse electric field normally formed in the channel region 14 by a voltage applied to the gate electrode 28. The problem is alleviated by lightly-doping source/drain regions 16A and 18A using a technique which aligns this doping procedure with the gate structure 26, 28. Spacers 30 and 32 are next formed on the walls of the gate structure 26, 28. Source/drain regions 16B and 18B are formed by an ion implantation, resulting in source/drain doping concentrations at normal levels, that aligns the source/drain regions 16B and 18B with the spacers 30 and 32, respectively. (While this two-level doping procedure effectively eliminates the "hot-carrier" problem, the resistance between the two source/drain dual regions 16A, 16B and 18A, 18B is increased.) The isolation structures 22, 24 provide electrical insulation between the device 5 and other areas of the integrated circuit.

In an effort to increase the density of components in an integrated circuit, the dimensions of the components have been increasingly reduced in scale. Many of the steps used in fabricating the components involve the use of masks that are patterned by optical techniques. For example, photoresist materials are used extensively. A layer of photoresist material is exposed to a pattern of (optical) radiation. The radiation changes the properties of the portions of the photoresist layer exposed to the radiation. Using these property changes, the photoresist layer can be processed to remove portions of the layer. The portions of the photoresist layer remaining after processing provide the pattern or mask for processing the integrated circuit. After years of continuously reducing the dimensions of the components of integrated circuits, limitations on optical resolution and on the registration of optical patterns are providing barriers for further reduction integrated circuit dimensions.

SUMMARY OF THE INVENTION

A need has therefore been felt for a technique for integrated circuit fabrication that has as a feature integrated circuit components having reduced dimensions compared to those available using current techniques. A further feature of the technique would be the fabrication of the reduced-dimension components without the use of masks requiring higher optical definition.

The aforementioned and other features are accomplished, according to the present invention, by using an etching process to reduce controllably the dimensions of a layer of material that has been patterned by an optical process. The material, with dimensions reduced by the etching process, then acts as a reduced-dimension mask for additional structure fabrication. Specifically, according to one embodiment of the present invention, a gate structure, provided with a layer of insulating material over the gate electrode, is formed with dimensions generally compatible with current optical technology. The insulating layer on the structure is then reduced by a controlled etching process. An oxide growth is then performed, the oxide growth covering the gate structure and the substrate. However, the insulating material has been selected such that the material does not participate in the oxide growth. The insulating material and the gate electrode are then anisotropically etched, the etching being stopped at the gate dielectric. As a result of this etching process, the original gate electrode has been separated into two gate electrodes. A source/drain implant is performed and spacers and conducting vias provided for coupling the device to an interconnect layer. The resulting structure includes two IGFET devices occupying roughly the area as a single device occupied previously. The fabrication of two IGFET devices was performed with a optical pattern resolution that previously provided only a single IGFET device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
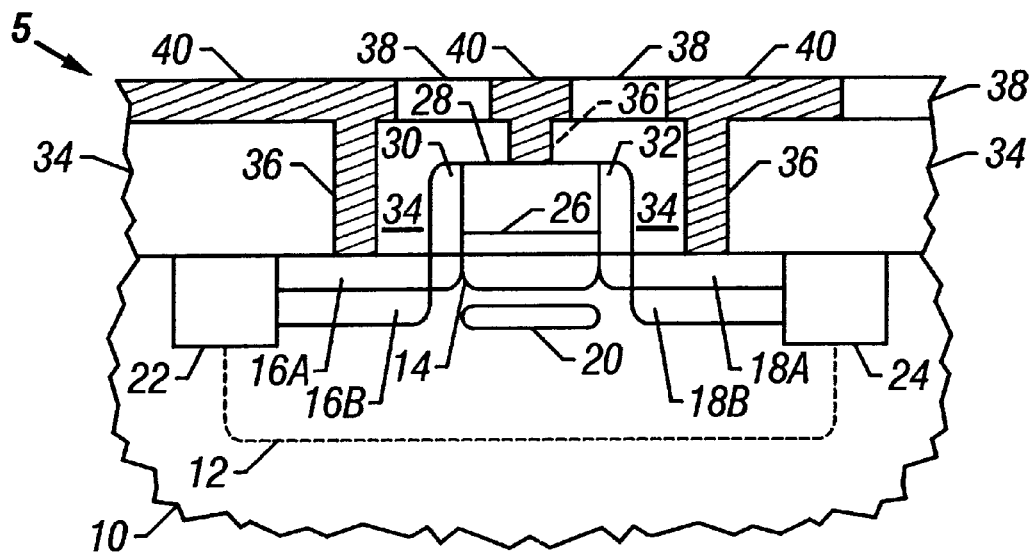
FIG. 1 is a cross-sectional view of a IGFET device fabricated according to the related art.

FIG. 1 has been described with respect to the related art.

Figure 2A:
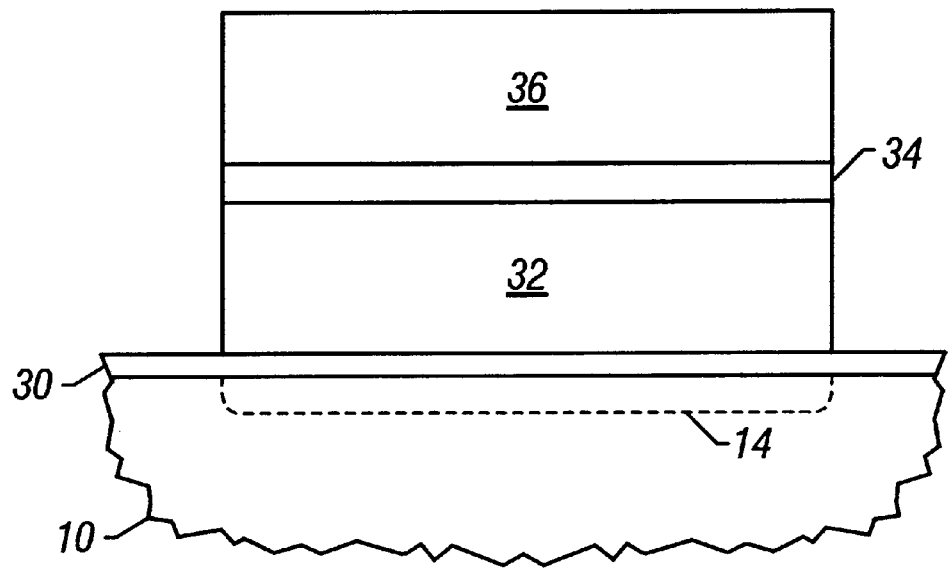
FIGS. 2A–2J are cross-sectional views illustrating the process of fabricating a plurality of IGFET devices according to the present invention.

Referring to FIG. 2A, the substrate 10 has a well region (not shown), a punchthrough region (not shown), and a channel region 14 formed therein. The channel region can be doped with arsenic ions or phosphorous ions to form an n-doped channel region, an n-doped punch-through region, and an n-doped well region; or can be doped with boron to form a p-doped channel region, a p-doped punch-through region, and a p-doped well region. (For the doping of the source/drain regions, the doping ions are reversed from those forming these regions in the substrate.) In order to implant the ions at the desired doping concentration and depth levels, phosphorous is implanted to form a channel region with an approximate energy of 15 to 150 keV with a total ion density of approximately $1 \times 10^{12}$ to $1 \times 10^{13}$ ions/cm$^2$; is implanted to form a punch-through region with an approximate energy of 75 to 225 keV with a total ion density of approximately $1 \times 10^{12}$ to $1 \times 10^{13}$ ions/cm$^2$, and is implanted to form a well region with an approximate energy of 150 to 600 keV at a total ion density of approximately $1 \times 10^{12}$ to $1 \times 10^{13}$ ions/cm$^2$. To implant ions at the desired doping concentrations and depth levels, boron is implanted to form a channel region with an approximate energy of 5 to 50 keV at a total doping density of approximately $1 \times 10^{12}$ to $1 \times 10^{13}$ ions/cm$^2$, is implanted to form a punch-through region with an approximate energy of 25 to 75 keV at a total concentration of approximately $1 \times 10^{12}$ to $1 \times 10^{13}$ ions/cm$^2$, and is implanted with an approximate energy of 50 to 200 keV at a total concentration of approximately $1 \times 10^{12}$ to $1 \times 10^{13}$ ions/cm$^2$ to form a well region. A gate dielectric layer 30 (e.g. silicon oxide, silicon nitride, silicon oxynitride, etc.) of 10–30 Å is formed over the substrate over the substrate 10 either before or after the formation of the implanted regions in the substrate 10. A gate electrode layer 32 of approximately 100 to 200 Å (typically polysilicon, but can be another conducting material), a dielectric layer 34 approximately 10 to 30 Å (for example, silicon nitride or silicon oxynitride) and a photoresist layer of approximately 1200 to 2000 Å are formed on the gate dielectric layer 30. The photoresist layer is patterned and the portions of the portions of the dielectric layer not patterned by the patterned photoresist layer 36 are removed, for example by an isotropic etch.

Figure 2B:
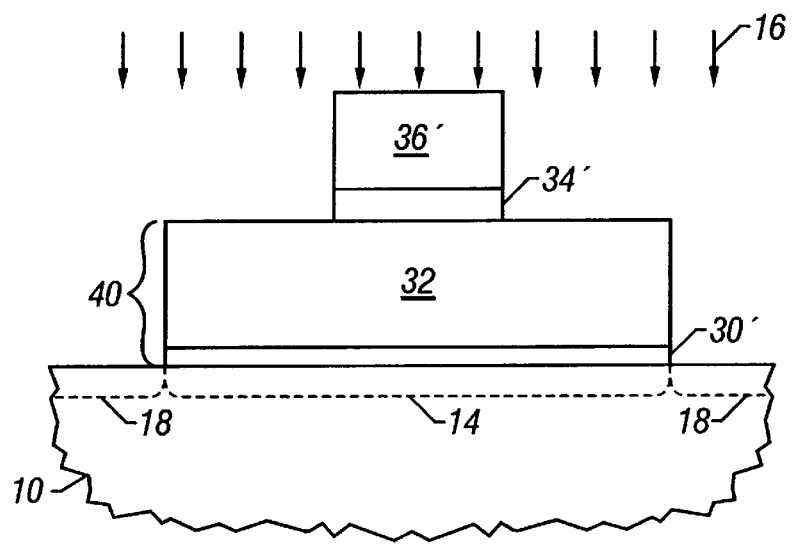

Referring next to FIG. 2B, a trim etch reduces the dimension of the pattern photoresist layer 36 to 36$^1$. Similarly, a nitride etching material reduces the dimensions of the dielectric layer 34 to a dielectric layer 34$^1$ having dimensions roughly equal to those of the reduced dimension photoresist layer. In addition, the gate dielectric layer 30 not in contact with the gate electrode 32 is removed to form gate dielectric 30$^1$. Gate electrode layer 32 and gate dielectric layer 30$^1$ form a gate structure 40 having typical gate structure dimensions for an integrated circuit using the current technology. In either the present device configuration or in the device configuration shown in FIG. 2A, an ion implant 16 can be performed to provide lightly-doped source/drain regions 18. Typical parameters for providing lightly-doped source/drain regions are a beam energy of 5–50 keV with a beam density of $1 \times 10^{13}$ to $1 \times 10^{14}$ ions/cm$^2$. These lightly-doped source/drain regions 18 are optional and are not shown in the Figures.

Figure 2C:
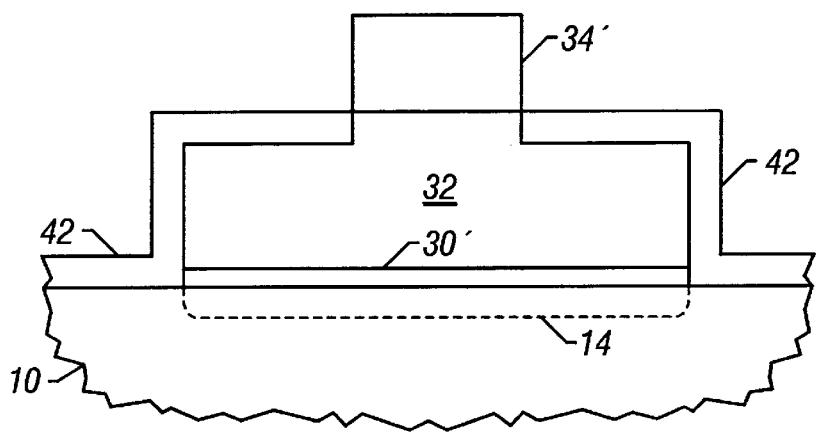

Referring to FIG. 2C, an oxide layer 42 is grown over the substrate 10 and the gate structure 40 by heating the device in an oxygen atmosphere to form an oxide layer of 25 to 75 Å. The dielectric layer 34$^1$ is relatively unaffected by the oxide formation. Note that dielectric layer 34$^1$ will extend across the top surface of gate electrode 32 (i.e., perpendicular to the illustrated cross-sectional view).

Figure 2D:
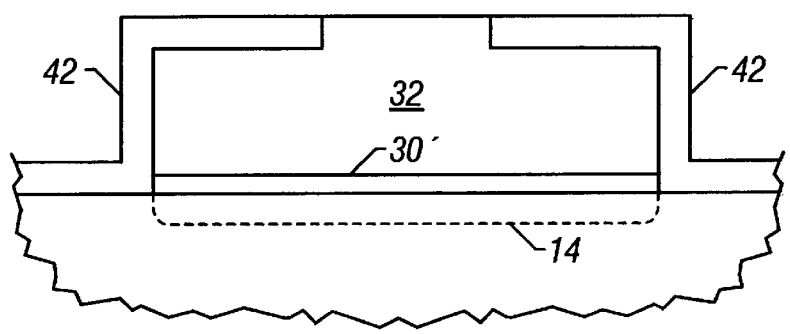

Referring to FIG. 2D, the (nitride or oxynitride) dielectric layer 34$^1$ is removed, exposing the (polysilicon) gate electrode 32.

Figure 2E:
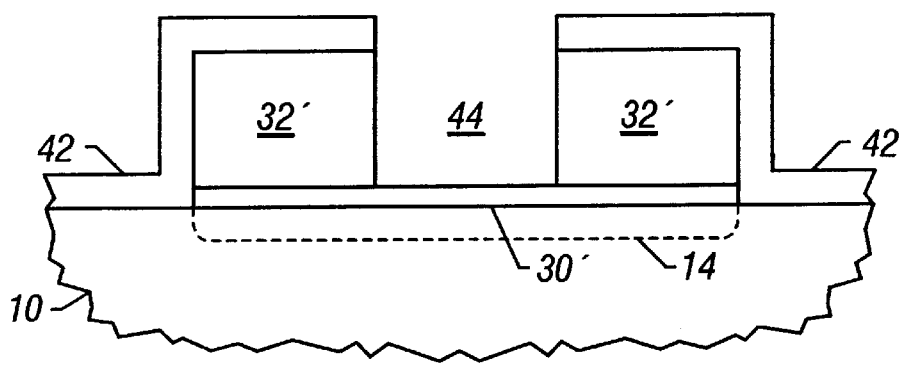

In FIG. 2E, an anisotropic etch is performed using an etchant that reacts with the (polysilicon) gate electrode 32, but not the silicon oxide layer 42. The etching process will be stopped by the (silicon oxide or silicon oxynitride) gate dielectric 30$^1$.

Referring next to FIG. 2F, FIG. 2G, and FIGS. 2H–2J, three embodiments of the invention originating from FIG. 2E are shown.

Figure 2F:
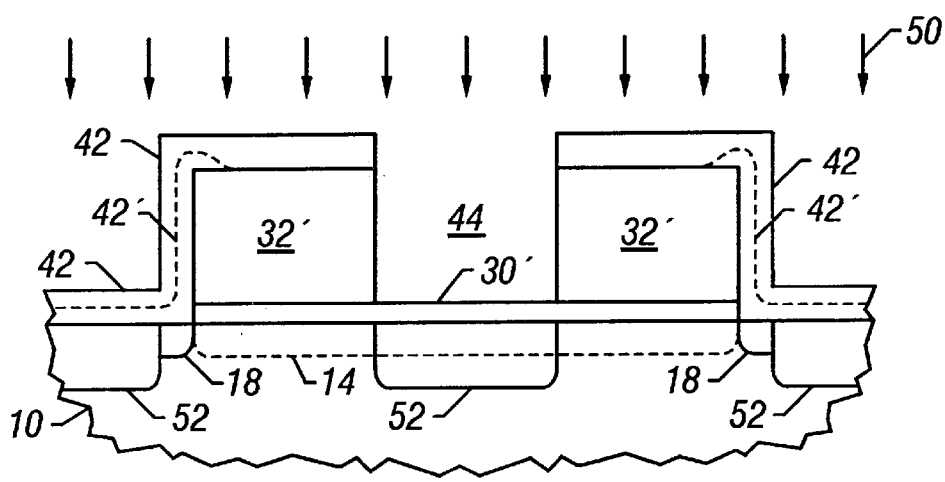

In the first embodiment shown in FIG. 2F, an etching process, if necessary, using an etchant specific to the oxide layer 42 is performed. In this embodiment, either the original oxide layer 42, or a portion thereof, on the walls of gate electrodes 32$^1$ is used to provide spacers for the alignment of ion implantation 50. The ion implantation provides normally-doped source/drain regions 52. Typical beam parameters for providing normally-doped source/drain regions are a beam energy of 5–50 keV and a beam density of $1 \times 10^{15}$ to $5 \times 10^{15}$ ions/cm$^2$. However, the spacers provided by the oxide layer on the outside of the two gate electrodes, or the portion remaining after a partial etching process, provides a barrier for the ion implantation 50. As a result, in the region proximate the channel region and outside of the two gate electrodes 32$^1$, the lightly-doped regions, formed previously, will not be appreciably changed by the ion implantation. In contradistinction, the channel region beneath the aperture 44 will be swamped by implantation 50 and this region will be a shared (i.e., by the two devices associated with the two gate electrodes 32$^1$) and normally-doped source/drain region. The bulk of the "hot-carrier" effects are found at the high voltage side of a pair of devices. Therefore, this configuration provides lightly-doped source/drain regions separating normally-doped source/drain regions and the channel region for the unshared source/drain terminals of a coupled IGFET device pair. The channel regions coupled to the shared source/drain region are not so-separated. However, this embodiment of the present invention provides relief for a major portion of "hot-carrier" effects.

Figure 2G:
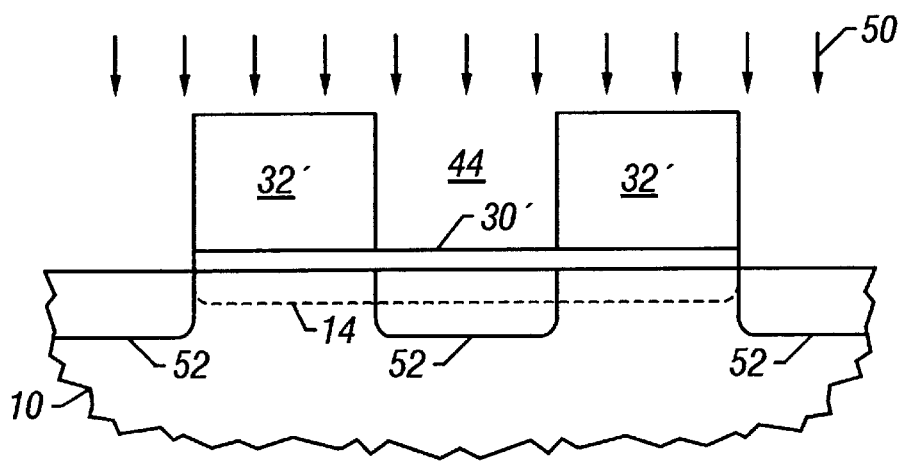

In FIG. 2G, a second embodiment of the present invention is illustrated. In this embodiment, the oxide layer 42 is completely removed. Ion implantation 50 results in normally-doped source/drains regions with no lightly-doped region separation between any of the source/drain regions and the two channel regions. As will be clear, in this embodiment, no effort has been made to use the techniques of lightly-doped source/drain regions to reduce the "hot-carrier" effects.

Figure 2H:
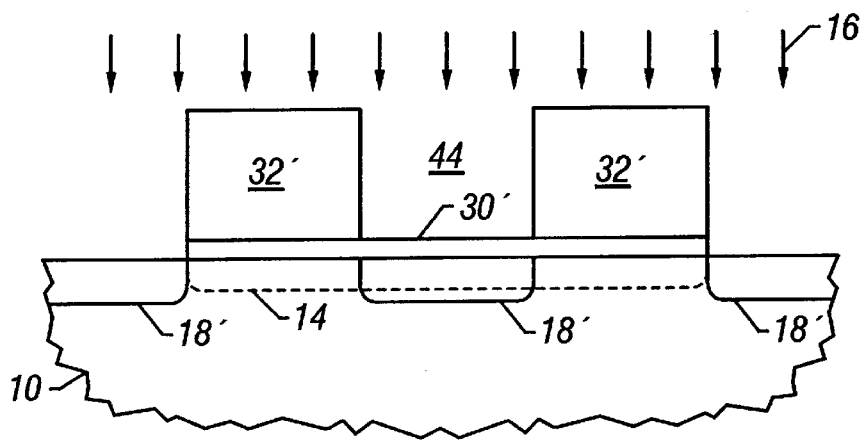
Figure 2I:
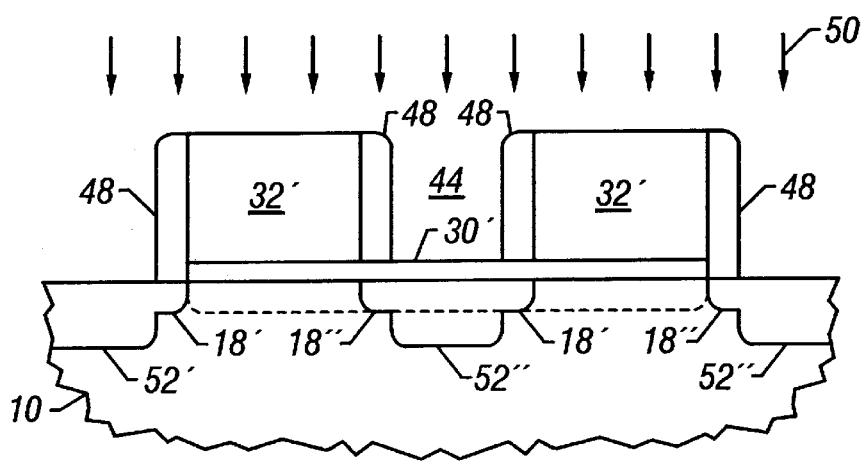
Figure 2J:
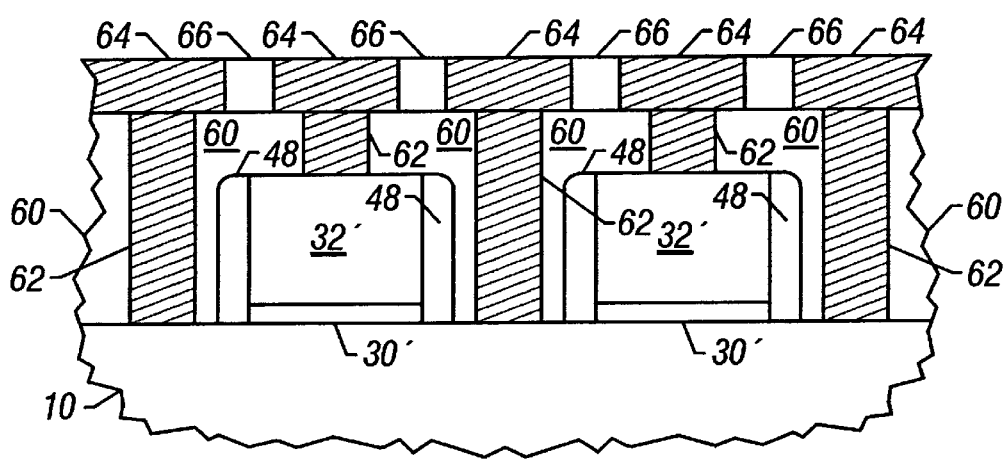

In FIG. 2H and FIG. 2I, a third embodiment of the present invention is illustrated. In this embodiment, as the second embodiment, the oxide layer 42 is completely removed as shown in FIG. 2H. However, instead of ion implantation 50 forming normally-doped source/drain regions, ion implantation $16^1$ is performed forming lightly-doped source/drain regions $18^1$ not only in the non-shared regions proximate the full channel region, but also beneath aperture 44. (This ion implantation separates what was previously a single channel region into two channel regions, each channel region associated with gate electrodes $32^1$.) In FIG. 2I, the spacers 48 are formed on the walls of the two gate electrodes $32^1$. Ion implantation $50^1$ is performed, this ion implantation providing normally-doped source/drain regions $52^1$. Because the spacers align ion implantation $50^1$, the lightly-doped regions proximate the channel regions are not appreciably affected by this new ion implantation $50^1$. Therefore, each normally-doped source/drain region $52^1$ is separated from the associated channel region 14 by a lightly-doped region $18^1$.

While the technique of separating normally-doped source/drain regions from channel regions by lightly-doped regions provides relief from the "hot-carrier" problem, a penalty is paid in increased resistance for the source/drain current. It is frequently advantageous when a source/drain terminal functions a high-voltage or drain terminal to provide lightly-doped source/drain regions for only that terminal. Even though "hot-carrier" effects are present at other terminals, a trade-off can be made between the "hot-carrier" effects and the additional resistance resulting from lightly-doped source/drain technique of minimizing these effects.

Referring to FIG. 2I, a completed IGFET device pair, fabricated according to the present invention, is shown. In this Figure, an insulating layer 60 is formed over the IGFET devices. Vias are formed in the insulating layer 60 and surfaces of the source/drain regions and the gate electrodes are exposed. At this point, steps can be taken to lower the contact resistance at the surface of the source/drain regions. Typically, metals such as cobalt or titanium are reacted with the exposed surfaces at temperatures of 550° C. to 700° C. to form a salicide, e.g., $CoSi_2$ or $TiSi_2$. After removal of excess metal, the salicide can be exposed to a temperature of 600° C. to 800° C., this process resulting in a phase change for the salicide that results in a lower resistance state. The exposed surfaces of the source/drain regions 42, the exposed surface of the gate electrodes $32^1$ and the walls of the vias have a liner, for example, of titanium or titanium nitride formed thereon. The vias are then fill with a conducting material, such as polysilicon or tungsten, to provide conducting vias 62. The conducting vias 62 are electrically coupled to conducting paths 64 formed, for example, of copper or aluminum in an insulating layer 66. The insulating layer 66 and the conducting paths 64 form the first interconnect layer. Interconnect layers provide the distribution of signals for the integrated circuit.

Those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

What is claimed:

1. A method of fabricating two insulated gate, field effect transistor devices, said method comprising:

forming a gate electrode structure and a dielectric layer on a top surface of said gate electrode structure, said gate electrode structure proximate and coextensive with a channel region in a substrate;

using a non-optical process, reducing a width dimension of said dielectric layer;

dividing said gate structure into at least two new gate structures, a separation of said two new gate structures determined by said width dimension of said dielectric layer; and implanting ions to form source/drain region in said substrate; each new gate structure having a shared source/drain region associated therewith, each new gate structure having a unshared source/drain electrode associated therewith.

2. The method as recited in claim 1 wherein said reducing includes:

forming a mask on a top surface of said dielectric layer; and performing an etch removing dielectric layer material not shadowed by said mask.

3. The method as recited in claim 2 wherein said dividing includes:

forming layer over said substrate and exposed portions of said gate structure;

removing said dielectric layer; and anisotropically etching said gate structure portions previously shadowed by said width dimension of said dielectric layer, wherein said anisotropically etching provides said two new gate structures.

4. The method as recited in claim 3 wherein said gate electrode is a polysilicon material, said dielectric layer is silicon nitride or silicon oxynitride, and said forming a layer over said substrate provides a layer of grown silicon oxide.

5. The method as recited in claim 1 wherein said doping includes providing said unshared source/drain regions with lightly doped source/drain regions.

6. The method as recited in claim 5 wherein said doping includes providing said shared source/drain regions with lightly-doped source/drain regions.

7. The method as recited in claim 1 wherein said gate structure and dielectric layer resulting from forming a gate electrode structure and a dielectric layer have a width dimension limited by an optical resolution of a system patterning a photoresist layer.

8. A method of providing a pair of insulated gate, field effect transistor (IGFET) devices, said method comprising:

forming a structure having first gate electrode and a coextensive preselected material layer formed thereon;

reducing selected dimensions of said preselected material layer by a non-optical process;

forming a protective coating on portions of said substrate and said first gate electrode not covered by said preselected material layer;

removing said preselected material layer;

anisotropically etching said first gate electrode in the region exposed by said removing said preselected material layer, said anisotropically etching step resulting in two second gate electrode structures; and doping regions of said substrate to form source/drain regions for said second gate electrodes, wherein said two second gate electrodes have a shared source/drain region.

9. The method as recited in claim 7 wherein said forming a structure includes forming said structure to be coextensive with a channel region.

10. The method as recited in claim 9 wherein said doping includes implanting ions to form said source/drain region.

11. The method as recited in claim 10 wherein said doping includes forming a lightly-doped portion of non-shared source/drain regions proximate said channel region.

12. The method as recited in claim 10 wherein said doping includes forming lightly-doped portions of said source/drain regions for second devices, said second gate electrodes each forming part of said second devices.

13. The method as recited in claim 12 wherein said doping includes:
   implanting ions to form lightly-doped regions aligned by said second gate electrodes;
   forming spacer structures on walls of said second gate electrodes; and
   implanting ions to form heavier-doped source/drain regions, said heavier-doped source/drain regions aligned by said spacers.

14. The method of claim 8 wherein said gate electrode is formed from polysilicon, wherein said preselected material layer is formed from silicon nitride or silicon oxynitride, and wherein said protective layer is formed from grown silicon oxide.

15. The method of claim 8 wherein said forming a structure includes anisotropic etching using a patterned photoresist layer, wherein at least one dimension of said structure is limited by the optical resolution of a system patterning said photoresist layer.

16. The method as recited in claim 15 wherein said reducing selected dimensions includes:
   etching said photoresist layer; and
   etching said preselected material layer to form a reverse pattern for said anisotropically etching said first gate electrode.

17. The method of fabricating reduced-dimension integrated circuit devices, said method comprising:
   fabricating a structure with dimensions parallel to a substrate determined by the resolution of a patterned mask;
   reducing dimensions of said patterned mask by chemical reaction;
   dividing said structure into at least two substructures, said substructures having dimensions determined by a reduced-dimension of said patterned mask; and
   using said substructures to align regions formed by implanted ions.

18. The method as recited in claim 17 wherein said substructures are each insulated gate, field effect transistor (IGFET) devices.

19. The method as recited in claim 18 wherein said regions formed by implanted ions are source/drain regions.

20. The method as recited in claim 19 wherein said reduced-dimension patterned mask is used to determine dimensions of a mask formed of silicon oxide.

21. The method as recited in claim 20 wherein selected source/drain regions of said IGFET devices have lightly-doped subregions.

* * * * *